US008929500B2

(12) United States Patent
Mukherjee et al.

(10) Patent No.: US 8,929,500 B2
(45) Date of Patent: Jan. 6, 2015

(54) CLOCK DATA RECOVERY WITH OUT-OF-LOCK DETECTION

(71) Applicant: Texas Instruments Incorporated, Dallas, TX (US)

(72) Inventors: Tonmoy S. Mukherjee, Atlanta, GA (US); Arlo J. Aude, Atlanta, GA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/746,075

(22) Filed: Jan. 21, 2013

(65) Prior Publication Data

US 2013/0188762 A1 Jul. 25, 2013

Related U.S. Application Data

(60) Provisional application No. 61/590,097, filed on Jan. 24, 2012.

(51) Int. Cl.
| | | |
|---|---|---|
| *H04L 7/00* | (2006.01) | |
| *H03L 7/095* | (2006.01) | |
| *H04L 7/033* | (2006.01) | |
| *H03L 7/087* | (2006.01) | |
| *H03L 7/089* | (2006.01) | |

(52) U.S. Cl.
CPC .............. *H04L 7/0016* (2013.01); *H03L 7/095* (2013.01); *H04L 7/033* (2013.01); *H03L 7/087* (2013.01); *H03L 7/0891* (2013.01); *H03L 2207/14* (2013.01)
USPC ............................ 375/371; 375/375; 327/160

(58) Field of Classification Search
CPC .......... H04L 7/0008; H04L 7/02; H04L 7/033
See application file for complete search history.

(56) References Cited

U.S. PATENT DOCUMENTS

| | | | |
|---|---|---|---|
| 3,820,030 A * | 6/1974 | Williams ....................... 327/160 |
| 6,853,696 B1 * | 2/2005 | Moser et al. ................... 375/375 |
| 2003/0050027 A1 * | 3/2003 | Muhammad et al. ......... 455/257 |
| 2007/0090887 A1 | 4/2007 | Seefeldt |
| 2010/0090732 A1 | 4/2010 | Lee |
| 2010/0104057 A1 | 4/2010 | Nedovic et al. |
| 2010/0241918 A1 | 9/2010 | Nedovic |
| 2011/0169535 A1 | 7/2011 | Kyles |

FOREIGN PATENT DOCUMENTS

WO PCT/US2013/022914 1/2013

OTHER PUBLICATIONS

"A 39-to-45-Gbit/s Multi-Data-Rate Clock and Data Recovery Circuit With a Robust Lock Detector", Hideyuki Nosaka, et al., IEEE Journal of Solid-State Circuits, vol. 39, No. 8, Aug. 2004, pp. 1361-1365.

* cited by examiner

*Primary Examiner* — Leon-Viet Nguyen
(74) *Attorney, Agent, or Firm* — Andrew Viger; Frederick J. Telecky, Jr.

(57) ABSTRACT

The disclosed clock-data recovery architecture includes out-of-lock (including false lock) detection. Out-of-lock detection is accomplished by sampling retimed/recovered data with positive and negative edges of the received data. In example embodiments, an out-of-lock condition is determined either by detecting the occurrence of, or counting, missed edges corresponding to the failure of received data sampling to detect corresponding positive/negative edges of the retimed/recovered data.

20 Claims, 3 Drawing Sheets

CLOCK DATA RECOVERY WITH OUT-OF-LOCK DETECTION

CROSS-REFERENCES TO RELATED APPLICATIONS

Priority is hereby claimed under USC §119(e) to U.S. Provisional Application 61/590,097, filed Jan. 24, 2012).

BACKGROUND

1. Technical Field

This Specification pertains generally to data communication receivers, and more specifically to recovering clock and data from a received data communication signal.

2. Related Art

In telecommunication and other data communication systems it is common to a transmit data with the associated clock embedded with the data. At the receive end, clock-data recovery (CDR) circuits extract the embedded clock information from received data, generating a recovered clock that is frequency and phase aligned to the embedded clock corresponding to the data transmission frequency. The recovered clock is then used to recover the transmitted/received data as retimed data that is frequency and phase aligned to the transmitted data.

CDR circuits commonly use a phase and frequency detector (PFD) to recover a clock aligned in frequency and phase to the embedded clock: a frequency acquisition loop includes a frequency detector (FD) that acquires a frequency close to the frequency of the embedded clock, and a phase tracking loop includes a phase detector (PD) that then phase aligns the recovered clock to the (frequency aligned) embedded clock. The recovered clock is used to generate recovered data from the received data, locked to the recovered clock which is aligned in frequency and phase to the embedded clock.

In some applications, the CDR includes a reference clock in the frequency acquisition loop, while for other applications, the CDR architecture is reference-less and only the position of the data edges is known.

Particularly (but not exclusively) for reference-less CDR designs, some mechanism for detecting an out-of-lock condition, including false lock, is advantageous. In false lock, the CDR circuit "locks" to a frequency different than the frequency of the transmitted data. In response to out-of-lock detection, the CDR can initiate a frequency/phase acquisition cycle to acquire true lock.

BRIEF SUMMARY

This Specification discloses and claims methods and apparatus for clock-data recovery with out-of-lock (including false lock) detection, such as used in telecommunication and other data communication applications. The Detailed Description and Figures set forth example embodiments that illustrate various aspects and technical features of the invention defined by the Claims.

Aspects and technical features of the claimed invention used at the receive end of a communications link to recover clock and data from a received data signal an embedded clock, include: (a) performing frequency and phase acquisition cycles to generate, from the received data signal, a recovered clock signal corresponding in frequency and phase to the embedded clock; (b) generating, from the received data signal and the recovered clock signal, a retimed/recovered data signal with positive and negative edges retimed by a predetermined amount relative to corresponding positive and negative edges of the received data signal; (c) sampling the recovered data signal with positive and negative edges of the received data signal, and generating an edge detection signal indicating for at least some of the samples whether a corresponding edge of the recovered data signal is detected; and (d) signaling an out-of-lock condition if the edge detection signal indicates failure to detect a predetermined number of edges of the recovered data signal (referred to as missed edges). In example embodiments, the edge detection signal is generated either (a) by detecting the occurrence of missed edges, or (b) by counting the number of missed edges.

Other aspects and technical features of the invention disclosed and claimed in this Specification will be apparent to those skilled in the art from the Description, Figures and Claims.

DETAILED DESCRIPTION

Figure 1:
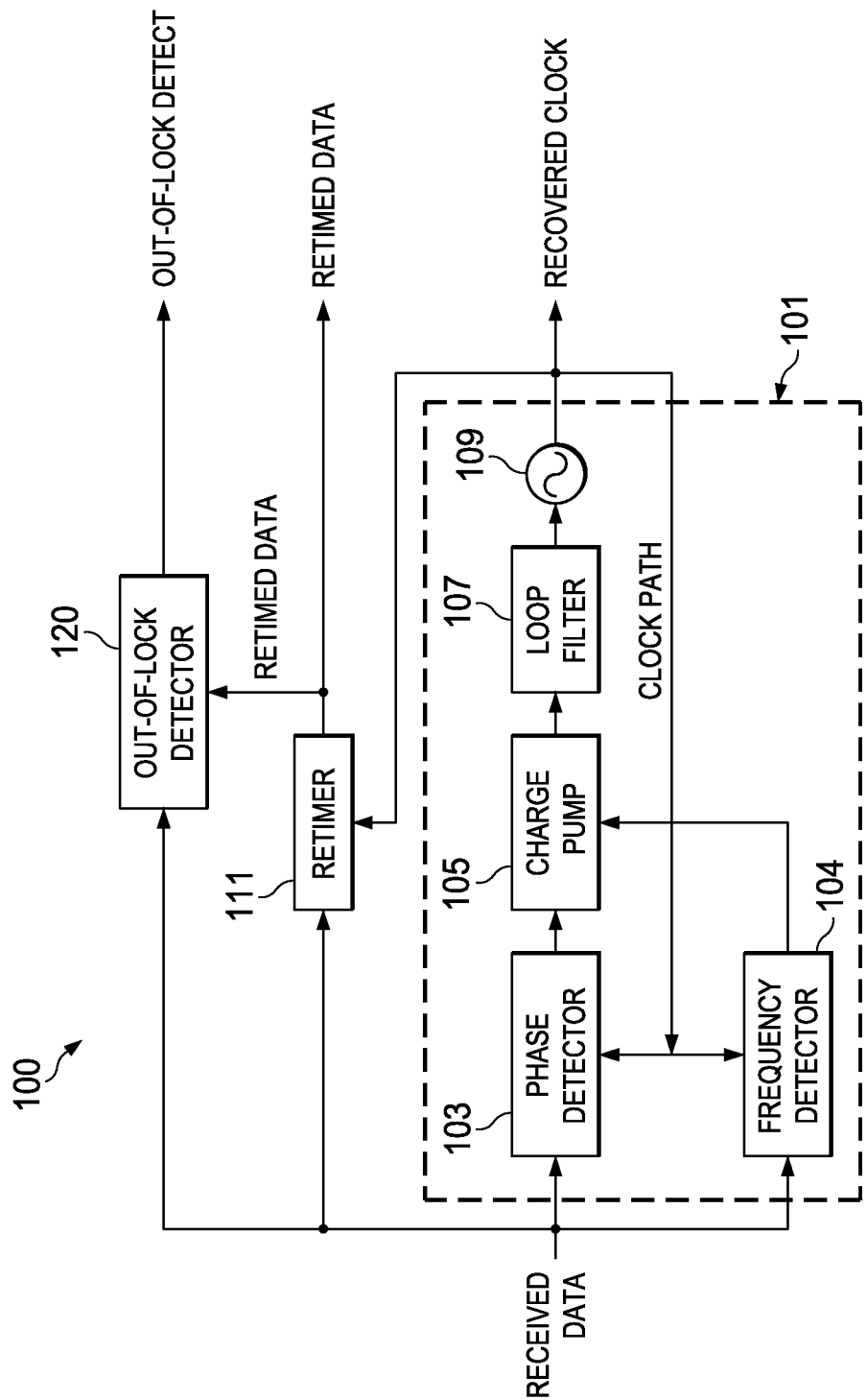
FIG. 1 illustrates an example embodiment of a clock data recovery architecture including out-of-lock detection.

This Detailed Description, together with the Figures, discloses example embodiments, and example applications, illustrating various aspects and technical features of the invention claimed in this Specification. However, these example embodiments and example applications, are illustrative only and should not be construed to limit the scope of the invention disclosed in this Specification, which is defined by the Claims. Other embodiments and applications will be apparent to those skilled in the art from the Description, Figures and Claims. Known circuits, functions and operations are not described in detail to avoid unnecessarily obscuring the principles and features of the claimed invention.

In brief overview, this Specification discloses and claims methods and apparatus for clock-data recovery with out-of-lock detection for use at the receive end of a communication link in data is transmitted an embedded clock. In an example methodology, out-of-lock detection is accomplished by (a) recovering from a received data signal a recovered clock corresponding in frequency an phase to the embedded clock, (b) recovering from the received data signal a retimed/recovered data signal using the recovered clock, with positive and negative edges retimed by a predetermined amount, (b) detecting an out-of-lock condition by sampling the retimed/recovered data with the positive and negative edges of the received data, and signaling an out-of-lock condition based on a failure of such sampling to detect corresponding edges of the retimed/recovered data signal (i.e., missed edges).

In an example embodiment of an architecture for clock-data recovery with out-of-lock detection, clock-data recovery circuitry is configured (a) to perform frequency and phase acquisition cycles, and generate a recovered clock signal corresponding in frequency and phase to the embedded clock; and (b) to generate from the received data signal and the recovered clock signal, a retimed/recovered data signal with positive and negative edges retimed by a predetermined amount relative to corresponding positive and negative edges of the received data signal. Edge detection circuitry is configured to sample the retimed/recovered data signal with positive and negative edges of the received data signal, and generate an edge detection signal indicating for at least some of the samples whether a corresponding edge of the recovered data signal is detected. Out-of-lock detection circuitry is configured to signal an out-of-lock condition if the edge detection signal indicates failure to detect a predetermined number of edges of the recovered data signal (i.e., missed edges).

In another example embodiment, the edge detection circuitry is configured to generate the edge detection signal based on (a) sampling the recovered data signal with the non-inverted received data signal to sample with positive edges, and with an inverted received data signal to sample with negative edges, generating the edge detection signal based on the results of sampling with at least some of the positive and negative edges of the received data signal. In alternate example embodiments, the edge detection circuitry is configured to generate the edge detection signal based on either (a) the occurrence of missed edges, or (b) counting the number of missed edges. In another example embodiment, the retimed/recovered data signal is generated with positive and negative edges retimed by substantially 0.5 unit interval relative to the corresponding positive and negative edges of the received data signal.

FIG. 1 illustrates an example embodiment of an architecture for performing clock data recovery (CDR) including out-of-lock detection according to this Specification. An example application is telecommunication or other serial digital data transport in which digital data is line coded (such as NRZ or non return to zero) for serial transmission with an embedded clock. As described in this Specification, at the receive end, clock-data recovery involves recovering from a received data signal the embedded clock as a recovered clock, which is used to generate recovered data from the received data.

In accordance with conventional clock-data recovery, the example reference-less CDR 100 includes a phase/frequency detector (PFD) 101 for clock recovery and a data retimer 111 for recovering/retiming data. The received data signal is input to PFD 101, which generates a recovered clock, and to retimer 111 which recovers and retimes data based on the recovered clock. As described further in connection with FIG. 3, the retimer generates a retimed/recovered data signal in which the positive and negative edges are retimed relative to the edges of the received data, according to this Specification.

Implementations for the PFD 101 and retimer 111 are a design choice, the design details of which are not required to enable practicing the invention claimed and disclosed in this Specification. For the example embodiment, PFD 101 is conventionally configured for frequency and phase acquisition cycles, including a frequency detector 104 and a phase detector (PD) 103, which establish nested frequency and phase acquisition loops that control an UP/DN charge pump 105. The charge pump provides a frequency tuning voltage through a loop filter 107 to a VCO (voltage controlled oscillator) 109. VCO 109 outputs a recovered clock that in true lock will be frequency and phase locked to the clock embedded with the received data.

In operation, CDR/PFD 101 initiates a frequency/phase acquisition cycle in which FD 104 and the frequency acquisition loop adjust the VOC frequency to the frequency of the embedded clock. At the end of the frequency acquisition cycle, FD 104 may be shut down, and CDR/PFD 101 initiates a phase acquisition/alignment cycle with PD 103 and the phase acquisition loop adjusting VOC phase to align with the phase of the embedded clock. When true lock is acquired, the recovered clock output from VCO 109 will be aligned in frequency and phase with the received data (i.e., the clock embedded in the received data).

Retimer 111 recovers data from the received data synchronized to the recovered clock provided by the clock recovery PFD 101. Retimer 111 operates conventionally to retime the recovered data, in effect retiming the positive/negative edges of the retimed/recovered data signal by a predetermined amount relative to the corresponding edges of the received data. Retiming operation is described further in connection with FIG. 3, but basically, for the example embodiment, retimer 111 is configured to retime the recovered data relative to the received data by substantially 0.5 unit interval (bit interval or period).

The example CDR architecture includes an out-of-lock detector 120. Out-of-lock detector 120 detects out-of-lock conditions, including false lock, by sampling the retimed/recovered data with the positive and negative edges of the received data. An out-of-lock condition is detected based on a failure of received data sampling to detect corresponding edges of the retimed/recovered data, which are referred to as missed edges. As used in this Specification, unless otherwise indicated by the context, an out-of-lock condition includes false lock in which the PFD "locks" to a frequency different than the frequency of the embedded clock, requiring initiation of a frequency/phase acquisition cycle to acquire true lock.

Figure 2A:
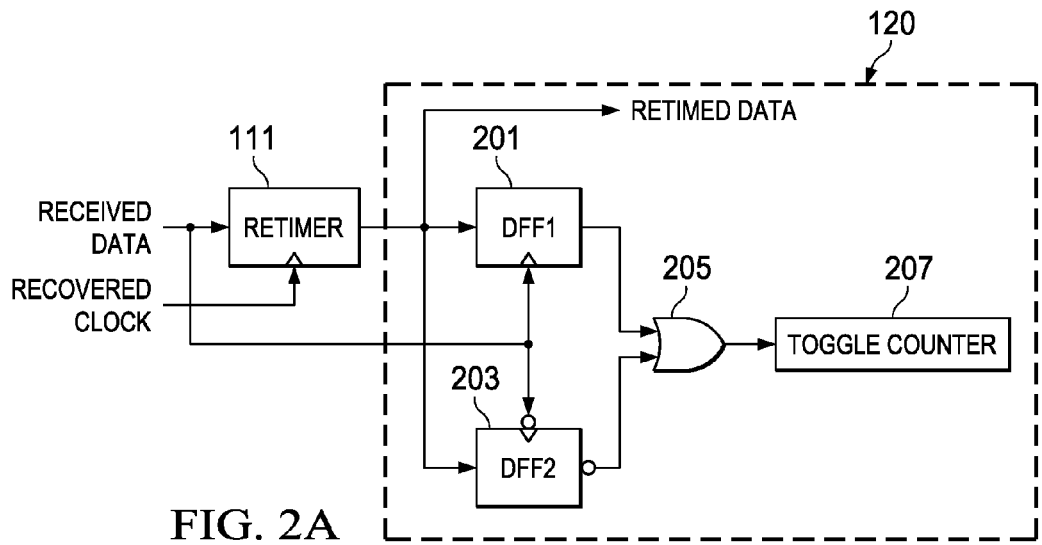
FIGS. 2A and 2B illustrate example embodiments of an out-of-lock detector according to this Specification, in which retimed/recovered data is sampled with positive and negative edges of the received data, where (2A) illustrates an example embodiment in which an out-of-lock condition corresponds to detecting the occurrence of a failure to detect edges of the recovered data, and (2B) illustrates an example embodiment in which the out-of-lock condition is corresponds to counting such missed edges.
Figure 2B:
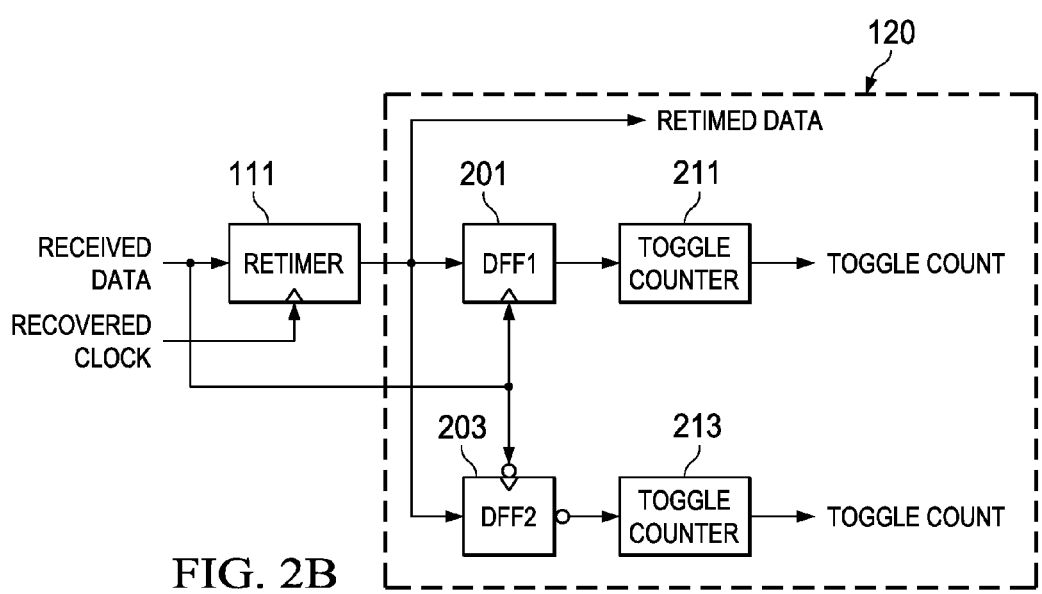

FIGS. 2A and 2B illustrate example embodiments of out-of-lock detector 120: FIG. 2A illustrates an example embodiment in which the out-of-lock detection is based on the occurrence of missed edges of the sampled retimed/recovered data, and FIG. 2B illustrates an example embodiment in which out-of-lock detection is based on counting missed edges of the sampled retimed/recovered data.

For both example embodiments, out-of-lock detector 120 includes D flip-flops (DFF) 201 and 203. Retimed/recovered data from retimer 111 is the data input to both DFFs-DFF 201 is clocked by the positive edge of the received data, and DFF 203 is clocked by the inverted received data corresponding to the negative edge. That is, the DFFs operate to sample the retimed/recovered data with the positive and negative edges of the received data (respectively DFF 201 and 203), capturing the state of the retimed/recovered data signal at the positive and negative edges of the received data signal.

The output of DFF 201 and the inverted output of DFF 203 constitute edge detection signals respectively for the positive and negative edges of the retimed/recovered data signal. These edge detection signals are used to detect an out-of-lock condition corresponding to the detection (by received data sampling) of missed edges in generating the retimed/recovered data based on the recovered clock (thereby indicating a failure to achieve true lock).

Figure 3:
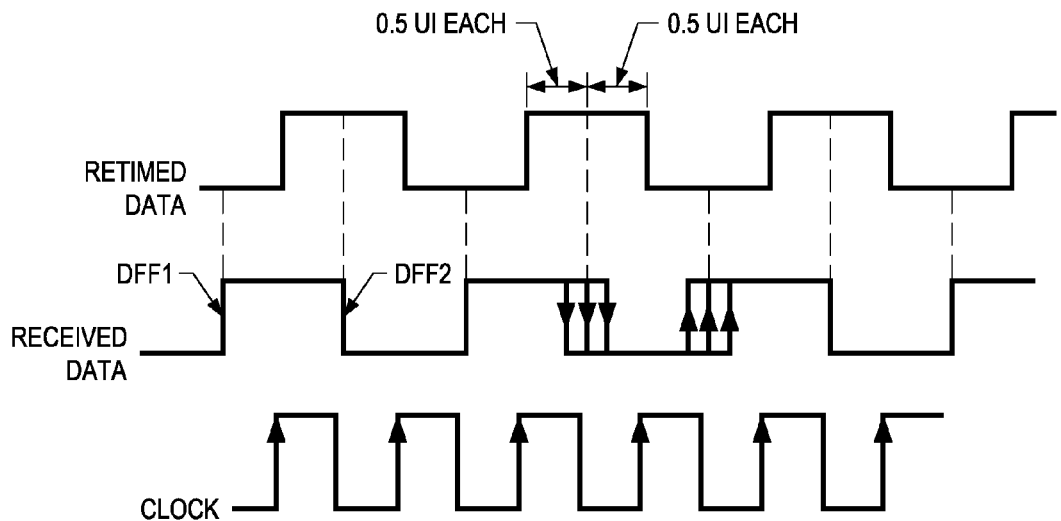
FIG. 3 illustrates example timing diagrams for retimed/recovered and received data, and the recovered clock, which illustrate an out-of-lock detection methodology according to this Specification.

FIG. 3 illustrates example timing diagrams for retimed/recovered and received data, and the recovered clock, which illustrate an out-of-lock detection methodology. Note that these timing diagrams, which indicate regular positive/negative transitions relative to the recovered clock, corresponding to regular bit periods (unit intervals), are only for illustration, and do not represent the positive/negative edge pattern of actual received data (and correspondingly the retimed/recovered data), which will typically be NRZ line coded and characterized by sequences of bit periods with the same data value and therefore without transitions.

Jitter tolerance is a CDR parameter indicating maximum input jitter for a specified bit error rate (BER), commonly specified in terms of a unit interval (UI) which is one clock period (or bit period). One UI of jitter tolerance results in the recovered data being 0.5 UI away from the received data edges.

For the example embodiments, the retimer retimes the positive/negative edges of the retimed/recovered data by substantially 0.5 UI. That is, the positive/negative edges of the retimed/recovered data are shifted substantially 0.5 UI relative to the positive/negative sampling edges of the received data.

As a result, the positive/negative sampling edges of the received data are positioned substantially in the center of the bit period of the retimed/recovered data. In true lock, as illustrated by the FIG. 3 timing diagrams for retimed/recovered data and received data, the positive edges of the received data will sample 0, and the negative edges of the receive data will sample 1.

If an out-of-lock condition (including false lock) occurs, the retimed/recovered data will not lock to the received data (i.e., frequency/phase alignment has not achieved true lock between the embedded and recovered clocks), and the recovered clock will "walk" across the retimed/received data. That is, the edge detection signals (from DFFs 201/203) will indicate missed edges of the retimed/recovered data based on a failure or received data sampling to detect corresponding edges of the retimed/recovered data.

Particularly for false lock conditions, referring also to the example CDR architecture in FIG. 1, during frequency acquisition FD 104 "locks" to a frequency different than the frequency of the transmitted data. During phase acquisition/alignment, PD 103 will attempt to align the phase of the recovered with the phase of the received data but will fail because of the frequency difference between the recovered clock and the clock embedded in the recovered data. As a result, retimer 111 will miss edges in generating retimed/recovered data from the received data based on the recovered (but out-of-lock) clock, and out-of-lock detector 120 will detect the missed edges as an out-of-lock (false lock) condition.

Referring to FIGS. 2A and 2B, for example embodiments of out-of-lock detector 120, out-of-lock detection is effected respectively by the toggle counter 207 in FIG. 2A and toggle counters 211/213 in FIG. 2B. In FIG. 2A, the positive edge detection signal from DFF 201 and the negative edge detection signal from DFF 203 (inverted) are input to OR gate 205, and a positive/negative edge detection signal is input to toggle counter 207. In FIG. 2B, the positive/negative edge detection signals from DFF 201/203 are input to respective toggle counters 211/213. For the example embodiment in FIG. 2A, an out-of-lock condition is detected as the occurrence of positive/negative missed edges, and for the example embodiment in FIG. 2B, an out-of-lock condition is detected by counting positive/negative missed edges.

For the example embodiment in FIG. 2A, the toggle counter detects the occurrence of missed edges based on the OR'ed combination of positive/negative edge detection signals, but does not provide a toggle count of the missed edges, reducing memory requirements without losing information relevant to out-of-lock detection. However, multiple consecutive missed edges may result for each toggle of the toggle counter 207. For the example embodiment in FIG. 2B, the separate toggle counters 211/213 provide separate positive/negative toggle counts corresponding to respective positive/negative edge detection signals from DFFs 201/203, such that an out-of-lock condition may be determined from the separate toggle count of positive/negative missed edges.

Figure 4:
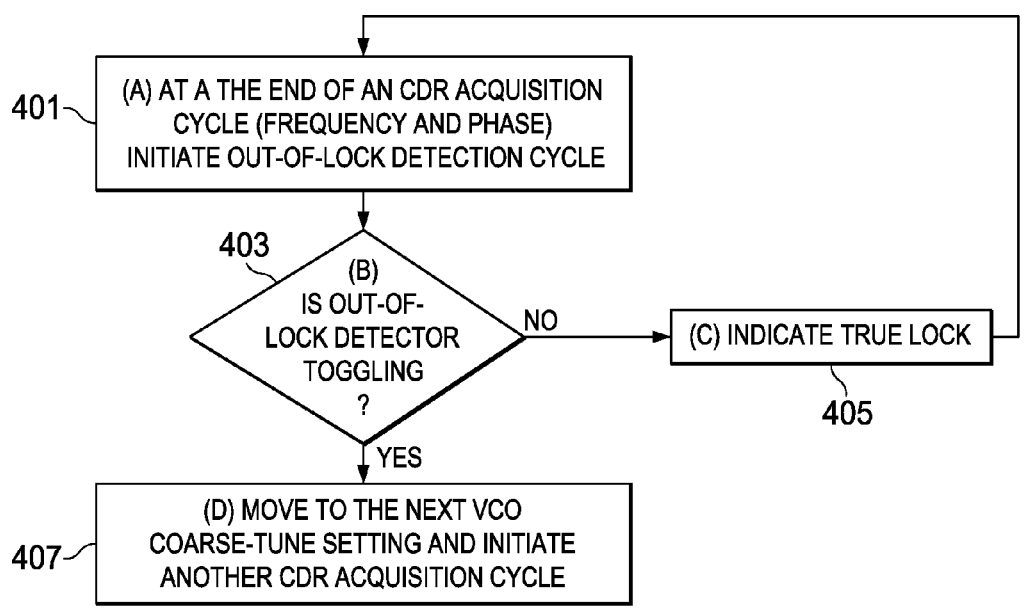
FIG. 4 illustrates an example method for out-of-lock detection according to this Specification.

FIG. 4 illustrates an example methodology for out-of-lock detection according to this Specification. Referring also to FIGS. 1 and 2A/2B, in accordance with conventional CDR operation, the CDR initiates a frequency/phase acquisition cycle to recover data and clock from the receive data. The CDR PFD 101 first initiates a frequency acquisition cycle (FD 104) followed by a phase detection/acquisition cycle (PD 103)—a frequency acquisition cycle typically begins with an initial VCO course tune setting.

At the end of the CDR acquisition cycle, an out-of-lock detection cycle is initiated (FIG. 4, 401) by out-of-lock detector 120. For the example embodiments, out-of-lock detection is determined (FIG. 4, 403) by the toggle output of the out-of-lock detector, as illustrated by in FIGS. 2A/2B in which DFFs 201/203 output edge detection signals to toggle counters 207 and 211/213.

If an out-of-lock condition is not detected (FIG. 4, 405), then true lock is established. For the example embodiments, true lock is represented by the toggle output settling to zero or some predetermined value close to zero. For example, if out-of-lock detector is active during the frequency/phase acquisition cycle, then the toggle output will initially toggle, and then, for true lock, settle to zero or the predetermined value representing true lock.

If an out-of-lock condition occurs (FIG. 4, 407), out-of-lock detector 120 will detect missed edges of the retimed/recovered data signal (based on received data sampling) as represented by the edge detection signals output from the positive/negative edge sampling DFFs 201/203. As a result, the out-of-lock detector output will toggle (FIG. 4, 403), signaling an out-of-lock condition, and the CDR will initiate an acquisition cycle to acquire true lock (for example, with a new course tune setting for FD 104).

The example embodiments of apparatus and methods for implementing the out-of-lock detection as disclosed in this Specification are described in the context of a reference-less CDR/PFD architecture, although the disclosed out-of-lock detection methodology is adaptable to different, including reference-based, CDR architectures. In addition, the out-of-lock detection methodology is operable to detect out-of-lock conditions in the presence of ambient jitter. Out-of-lock detection will include false lock detection. Advantageously, during true lock, the output of the detector is constant so that memory requirements are minimized.

While this Specification has disclosed certain example embodiments and generally associated methods, the principles and features of the claimed invention may be implemented in or with any suitably arranged device or system, and various design choices are possible without departing from the scope of the invention as defined by the Claims. Accordingly, the above description of exemplary embodiments does not define or constrain the scope of the invention, which shall be defined by the following Claims.

The invention claimed is:

1. A method of clock-data recovery with out-of-lock detection, comprising:

receiving a received data signal corresponding to data transmitted with an embedded clock;

performing frequency and phase acquisition cycles to generate, from the received data signal, a recovered clock signal corresponding in frequency and phase to the embedded clock;

generating, from the received data signal and the recovered clock signal, a recovered data signal with positive and negative edges retimed by a predetermined amount relative to corresponding positive and negative edges of the received data signal;

sampling the recovered data signal with positive and negative edges of the received data signal, and generating an edge detection signal indicating for at least some of the samples whether a corresponding edge of the recovered data signal is detected; and signaling an out-of-lock condition if the edge detection signal indicates failure to detect a predetermined number of edges of the recovered data signal.

2. The method of claim 1, further comprising initiating, in response to an out-of-lock condition, frequency and phase acquisition cycles.

3. The method of claim 1, wherein the edge detection signal is generated by counting the number of edges of the recovered data signal that sampling with the received data signal fails to detect.

4. The method of claim 1 wherein sampling the recovered data signal comprises sampling the recovered data signal with the non-inverted received data signal to sample with positive edges, and an inverted received data signal to sample with negative edges.

5. The method of claim 1, wherein the recovered data signal is generated with positive and negative edges retimed by substantially 0.5 unit interval relative to the corresponding positive and negative edges of the received data signal.

6. A circuit for clock-data recovery with out-of-lock detection, comprising:

clock-data recovery circuitry coupled to receive a received data signal corresponding to data transmitted with an embedded clock, and configured to:
  perform frequency and phase acquisition cycles, and generate, in response to the received data signal, a recovered clock signal corresponding in frequency and phase to the embedded clock; and
  generate, in response to the received data signal and the recovered clock signal, a recovered data signal corresponding to the received data signal, with positive and negative edges retimed by a predetermined amount relative to corresponding positive and negative edges of the received data signal;
edge detection circuitry configured to sample the recovered data signal with positive and negative edges of the received data signal, and generate an edge detection signal indicating for at least some of the samples whether a corresponding edge of the recovered data signal is detected; and
out-of-lock detection circuitry configured to signal an out-of-lock condition if the edge detection signal indicates failure to detect a predetermined number of edges of the recovered data signal.

7. The circuit of claim 6, wherein the clock recovery circuitry is configured to initiate, in response to an out-of-lock condition, frequency and phase acquisition cycles.

8. The circuit of claim 6:
wherein the edge detection circuitry is configured to generate the edge detection signal based on counting the number of edges of the recovered data signal that sampling with the received data signal fails to detect.

9. The circuit of claim 6, wherein the edge detection circuitry is configured to sample the recovered data signal with the non-inverted received data signal to sample with positive edges, and an inverted received data signal to sample with negative edges.

10. The circuit of claim 9, wherein the edge detection circuitry includes (a) a first flip-flop coupled to receive the recovered data signal and clocked by the non-inverted received data signal, thereby sampling the recovered data signal to detect positive edges as an edge detection signal, and (b) a second flip-flop coupled to receive the recovered data signal and clocked by the inverted received data signal, thereby sampling the recovered data signal to detect negative edges of the recovered data signal as an edge detection signal.

11. The circuit of claim 10:
wherein the edge detection circuitry includes one of: (a) a toggle counter coupled to receive a logically OR'ed sampling output of the first flip-flop and inverted sampling output of the second flip-flop, and output as the edge detection signal a toggle count corresponding to the occurrence of missed edges, and (b) first and second toggle counters respectively coupled to receive the sampling output of the first flip-flop and the inverted sampling output of the second flip-flop, and as respective edge detection signals respective toggle counts corresponding to the number of edges; and
wherein the out-of-lock detection circuitry signals an out-of-lock condition based on one of (a) the output of the toggle counter indicating the occurrence of missed edges, and (b) the outputs of the toggle counters indicating the number of missed edges.

12. The circuit of claim 6, wherein the recovered data signal is generated with positive and negative edges retimed by substantially 0.5 unit interval relative to the corresponding positive and negative edges of the received data signal.

13. The circuit of claim 6, further comprising receive circuitry coupled to receive a received data signal corresponding to data transmitted with an embedded clock, and wherein the clock-data recovery circuitry comprises:
clock recovery circuitry responsive to the received data signal and configured to perform frequency and phase acquisition cycles to generate a recovered clock signal corresponding in frequency and phase to the embedded clock; and
retimer circuitry responsive to the received data signal and the recovered clock signal, and configured to generate a recovered data signal corresponding to the received data signal with positive and negative edges retimed by a predetermined amount relative to corresponding positive and negative edges of the received data signal;
the clock recovery circuitry including:
  a voltage controlled oscillator responsive to frequency/phase control signals to provide, as a recovered clock signal, a VCO output corresponding in frequency and phase to the embedded clock;
  a frequency detector coupled to receive the received data signal and the VCO output, and configured to establish a frequency acquisition loop operable to generate a frequency control signal corresponding to a difference in frequency between the VCO output and the embedded clock; and
  a phase detector coupled to receive the received data signal and the VCO output, and configured to establish a phase acquisition loop operable to generate a phase control signal corresponding to a difference in phase between the VCO output and the embedded clock.

14. A data communications link, comprising:

a transmitter configured to transmit serial digital data with an embedded clock; and a receiver configured to receive a received data signal corresponding to the transmitted serial data and the embedded clock;

the receiver including clock-data recovery circuitry configured to:

perform frequency and phase acquisition cycles, and generate, in response to the received data signal, a recovered clock signal corresponding in frequency and phase to the embedded clock; and generate, in response to the received data signal and the recovered clock signal, a recovered data signal corresponding to the received data signal, with positive and negative edges retimed by a predetermined amount relative to corresponding positive and negative edges of the received data signal;

edge detection circuitry configured to sample the recovered data signal with positive and negative edges of the received data signal, and generate an edge detection signal indicating for at least some of the samples whether a corresponding edge of the recovered data signal is detected; and out-of-lock detection circuitry configured to signal an out-of-lock condition if the edge detection signal indicates failure to detect a predetermined number of edges of the recovered data signal.

15. The circuit of claim 14:

wherein the edge detection circuitry is configured to generate the edge detection signal based on counting the number of edges of the recovered data signal that sampling with the received data signal fails to detect.

16. The circuit of claim 14, wherein the edge detection circuitry is configured to sample the recovered data signal with the non-inverted received data signal to sample with positive edges, and an inverted received data signal to sample with negative edges.

17. The circuit of claim 16, wherein the edge detection circuitry includes (a) a first flip-flop coupled to receive the recovered data signal and clocked by the non-inverted received data signal, thereby sampling the recovered data signal to detect positive edges as an edge detection signal, and (b) a second flip-flop coupled to receive the recovered data signal and clocked by the inverted received data signal, thereby sampling the recovered data signal to detect negative edges of the recovered data signal as an edge detection signal.

18. The circuit of claim 17:

wherein the edge detection circuitry includes one of: (a) a toggle counter coupled to receive a logically OR'ed sampling output of the first flip-flop and inverted sampling output of the second flip-flop, and output as the edge detection signal a toggle count corresponding to the occurrence of missed edges, and (b) first and second toggle counters respectively coupled to receive the sampling output of the first flip-flop and the inverted sampling output of the second flip-flop, and as respective edge detection signals respective toggle counts corresponding to the number of edges; and wherein the out-of-lock detection circuitry signals an out-of-lock condition based on one of (a) the output of the toggle counter indicating the occurrence of missed edges, and (b) the outputs of the toggle counters indicating the number of missed edges.

19. The circuit of claim 14, wherein the recovered data signal is generated with positive and negative edges retimed by substantially 0.5 unit interval relative to the corresponding positive and negative edges of the received data signal.

20. The circuit of claim 14, wherein the clock-data recovery circuitry comprises:

clock recovery circuitry responsive to the received data signal and configured to perform frequency and phase acquisition cycles to generate a recovered clock signal corresponding in frequency and phase to the embedded clock; and retimer circuitry responsive to the received data signal and the recovered clock signal, and configured to generate a recovered data signal corresponding to the received data signal with positive and negative edges retimed by a predetermined amount relative to corresponding positive and negative edges of the received data signal;

the clock recovery circuitry including:

a voltage controlled oscillator responsive to frequency/phase control signals to provide, as a recovered clock signal, a VCO output corresponding in frequency and phase to the embedded clock;

a frequency detector coupled to receive the received data signal and the VCO output, and configured to establish a frequency acquisition loop operable to generate a frequency control signal corresponding to a difference in frequency between the VCO output and the embedded clock; and a phase detector coupled to receive the received data signal and the VCO output, and configured to establish a phase acquisition loop operable to generate a phase control signal corresponding to a difference in phase between the VCO output and the embedded clock.

* * * * *